United States Patent
Shim et al.

(10) Patent No.: US 10,181,279 B2
(45) Date of Patent: Jan. 15, 2019

(54) SHIFT REGISTER AND DISPLAY DEVICE INCLUDING THE SAME

(71) Applicant: LG Display Co., Ltd., Seoul (KR)

(72) Inventors: Dahye Shim, Gyeonggi-do (KR); Haye Kim, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 281 days.

(21) Appl. No.: 15/285,856

(22) Filed: Oct. 5, 2016

(65) Prior Publication Data

US 2017/0116911 A1  Apr. 27, 2017

(30) Foreign Application Priority Data

Oct. 27, 2015 (KR) .................. 10-2015-0149795

(51) Int. Cl.
| | | |
|---|---|---|
| G11C 19/00 | (2006.01) |
| G09G 3/20 | (2006.01) |
| G11C 19/28 | (2006.01) |
| G09G 3/3266 | (2016.01) |
| G09G 3/36 | (2006.01) |

(52) U.S. Cl.
CPC ......... *G09G 3/2092* (2013.01); *G09G 3/3266* (2013.01); *G11C 19/28* (2013.01); *G09G 3/3677* (2013.01); *G09G 2300/0408* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 7,400,698 B2* | 7/2008 | Chang | .................... | G11C 19/28 377/64 |
| 7,778,379 B2* | 8/2010 | Liao | ....................... | G11C 19/28 377/64 |
| 2009/0167668 A1* | 7/2009 | Kim | ....................... | G09G 3/3677 345/100 |
| 2011/0007863 A1* | 1/2011 | Tsai | ....................... | G11C 19/28 377/79 |
| 2015/0016585 A1* | 1/2015 | Toyotaka | ............. | G11C 19/287 377/77 |
| 2016/0247442 A1* | 8/2016 | Dai | ....................... | G09G 3/3677 |
| 2016/0379546 A1* | 12/2016 | Kim | ....................... | G09G 3/2092 345/213 |
| 2017/0032731 A1* | 2/2017 | Shim | .................... | G09G 3/3677 |
| 2017/0116945 A1* | 4/2017 | Cho | ....................... | G09G 3/3677 |
| 2017/0193957 A1* | 7/2017 | Liu | ....................... | G09G 3/3696 |

* cited by examiner

*Primary Examiner* — Tuan T Lam

(74) *Attorney, Agent, or Firm* — Morgan, Lewis & Bockius LLP

(57) ABSTRACT

A shift register and a display device including the same are provided. The shift register includes a first stage sequentially outputting a gate pulse to first and second gate lines of a pixel array corresponding to a voltage of a first Q node and a second stage sequentially outputting the gate pulse to third and fourth gate lines of the pixel array corresponding to a voltage of a second Q node. The first stage includes a start controller charged with the voltage of the first Q node, a first pull-up transistor increasing a voltage of a first output terminal in response to the voltage of the first Q node and a first gate clock, and a second pull-up transistor increasing a voltage of a second output terminal in response to the voltage of the first Q node and a second gate clock.

12 Claims, 6 Drawing Sheets

SHIFT REGISTER AND DISPLAY DEVICE INCLUDING THE SAME

This application claims the benefit of Korea Patent Application No. 10-2015-0149795 filed on Oct. 27, 2015, the entire contents of which is incorporated herein by reference for all purposes as if fully set forth herein.

BACKGROUND OF THE INVENTION

Field of the Invention

The present disclosure relates to a display device, and more particularly, to a shift register and a display device including the shift register capable of reducing a bezel size.

Discussion of the Related Art

A display device is configured such that data lines and gate lines are disposed to cross each other at right angles and pixels are arranged in a matrix form. A video data voltage is supplied to the data lines, and a gate pulse is sequentially supplied to the gate lines. The video data voltage is supplied to pixels of a display line supplied with the gate pulse, and all of display lines are sequentially scanned by the gate pulse and display video data.

A gate driving circuit of a flat panel display for supplying a gate pulse to gate lines generally includes a plurality of gate driver integrated circuits (ICs). Each gate driver IC basically includes a shift register for sequentially outputting the gate pulse. Each gate driver IC may further include a plurality of circuits for controlling output voltages of the shift register based on driving characteristics of a display panel and a plurality of output buffers.

In the display device, a gate driver producing a scan signal (i.e., the gate pulse) may be implemented as a gate-in-panel (GIP) type gate driver configured as a combination of thin film transistors in a bezel area (i.e., a non-display area) of the display panel. The GIP type gate driver includes stages corresponding to the number of gate lines, and the stages respectively corresponding to the gate lines output the gate pulse to the gate lines. Thus, because the number of stages required in the gate driver is the same as the number of gate lines, a GIP structure leads to an increase in a size of the bezel area.

SUMMARY

Accordingly, the present invention is directed to a shift register and a display device that substantially obviate one or more of the problems due to limitations and disadvantages of the related art.

An object of the present invention is to provide a display device with a bezel area having reduced size.

Another object of the present invention is to provide a display device that can remove a delay difference of a gate pulse.

Another object of the present invention is to provide a display device that can prevent a horizontal dim phenomenon.

Another object of the present invention is to provide a display device that is easily and efficiently manufactured.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a shift register configured to sequentially output a gate pulse to gate lines of a pixel array comprises a first stage configured to sequentially output a gate pulse to first and second gate lines of the pixel array corresponding to a voltage of a first Q node, and a second stage configured to sequentially output a gate pulse to third and fourth gate lines of the pixel array corresponding to a voltage of a second Q node, wherein the first stage includes a start controller charged with the voltage of the first Q node, a first pull-up transistor configured to increase a voltage of a first output terminal in response to the voltage of the first Q node and a first gate clock, a second pull-up transistor configured to increase a voltage of a second output terminal in response to the voltage of the first Q node and a second gate clock, and a compensation transistor configured to discharge the second gate clock using the voltage of the second Q node as a gate voltage.

In another aspect, a display device comprises a pixel array disposed in a display area, a shift register positioned outside the pixel array and configured to sequentially output a gate pulse to gate lines of the pixel array, and a data driver configured to output a data voltage in synchronization with the gate pulse, wherein the shift register includes a first stage configured to sequentially output the gate pulse to first and second gate lines of the pixel array corresponding to a voltage of a first Q node, and a second stage configured to sequentially output the gate pulse to third and fourth gate lines of the pixel array corresponding to a voltage of a second Q node, wherein the first stage includes a start controller charged with the voltage of the first Q node, a first pull-up transistor configured to increase a voltage of a first output terminal in response to the voltage of the first Q node and a first gate clock, a second pull-up transistor configured to increase a voltage of a second output terminal in response to the voltage of the first Q node and a second gate clock, and a compensation transistor configured to discharge the second gate clock using the voltage of the second Q node as a gate voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of the respective elements used in the following explanations are selected only for convenience of writing the specification and may be thus different from those used in actual products.

Figure 1:
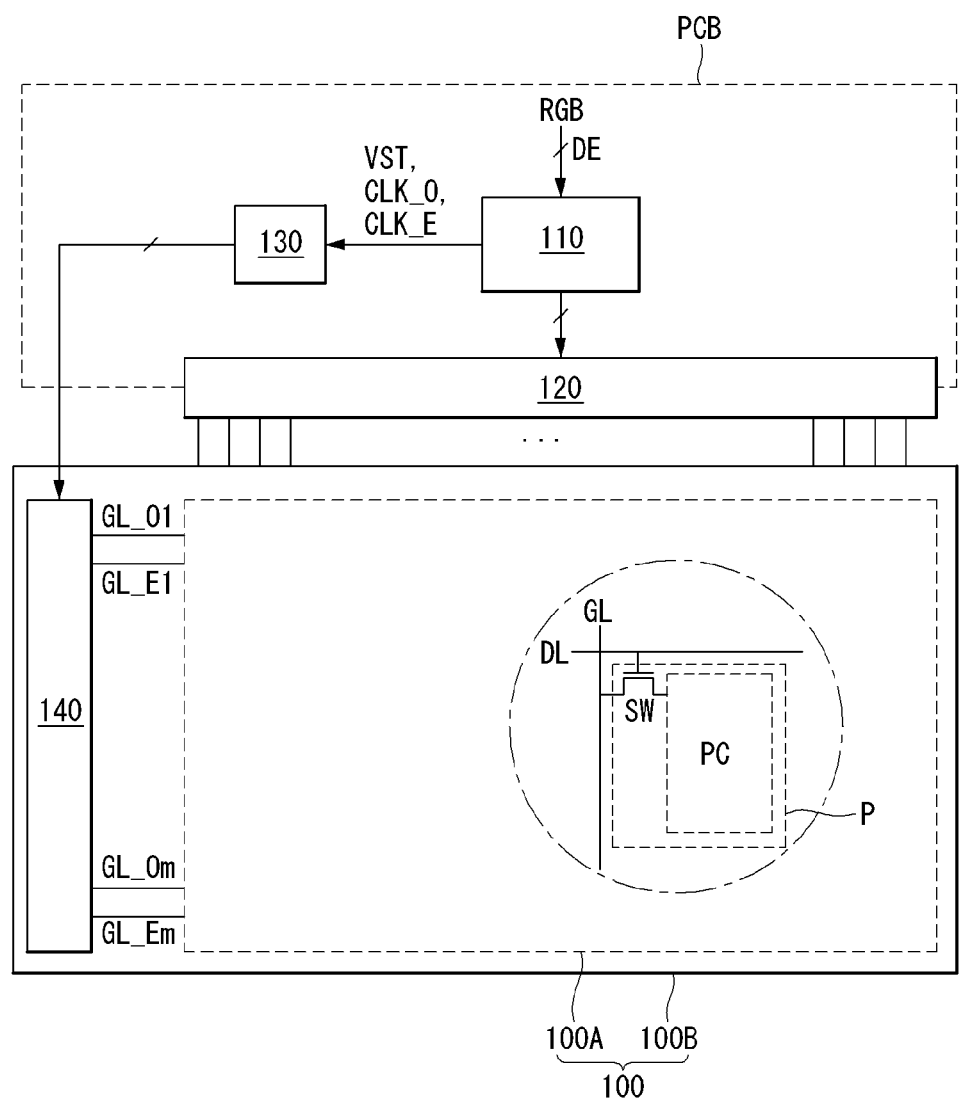
FIG. 1 illustrates a configuration of a display device according to an embodiment of the invention.

FIG. 1 illustrates a display device according to an embodiment of the invention.

With reference to FIG. 1, a display device according to an embodiment of the invention includes a display panel 100, a timing controller 110, a data driver 120, and gate drivers 130 and 140.

The display panel 100 includes a display area 100A, in which pixels P are formed, and a non-display area 100B, positioned outside the display area 100A, in which various signal lines, pads, etc. are formed. The display area 100A includes the plurality of pixels P and displays an image based on a gray level represented by each pixel P. The plurality of pixels P is arranged on each horizontal line and entirely forms a matrix form on the display area 100A. Each pixel P is formed at a crossing of a data line DL and a gate line GL crossing each other. The gate line GL includes first to mth odd-numbered gate lines GL_O1 to GL_Om and first to mth even-numbered gate lines GL_E1 to GL_Em, where 'm' is a natural number. For example, an ith odd-numbered gate line GL_Oi and an ith even-numbered gate line GL_Ei are positioned adjacent to each other, where 'i' is a natural number equal to or less than 'm'.

Each pixel P includes a pixel circuit PC operating in response to a data signal DATA supplied in synchronization with a scan signal supplied through a switching element SW connected to the data line DL and the gate line GL. The pixel circuit PC and the switching element SW may be implemented as other types depending on kinds of the display panel.

The timing controller 110 receives a timing signal, such as a vertical sync signal Vsync, a horizontal sync signal Hsync, a data enable signal DE, and a main clock MCLK, from a host computer through a low voltage differential signaling (LVDS) or transition minimized differential signaling (TMDS) interface receiving circuit. The timing controller 110 generate timing control signals for controlling operation timings of a data driving circuit and a gate driving circuit based on the timing signal received from the host computer. The timing control signals include a scan timing control signal for controlling the operation timing of the gate driving circuit and a data timing control signal for controlling the operation timing of the data driver 120 and a polarity of a data voltage.

The scan timing control signal includes a start signal VST, an odd-numbered gate clock CLK_O, an even-numbered gate clock CLK_E, a subsequent signal NEXT, and the like. The start signal VST is input to a shift register 140 and controls shift start timing. The odd-numbered gate clock CLK_O and the even-numbered gate clock CLK_E are level-shifted through a level shifter 130 and then is input to the shift register 140. After a shift register 140 outputs a pair of odd-numbered gate pulses Gout_O and a pair of even-numbered gate pulses Gout_E, the subsequent signal NEXT initializes each node of the shift register 140.

The data timing control signal includes a source start pulse SSP, a source sampling clock SSC, a source output enable signal SOE, and the like. The source start pulse SSP controls shift start timing of source driver ICs 120. The source sampling clock SSC controls sampling timing of data in the source driver ICs 120 based on a rising or falling edge.

The data driver 120 receives digital video data RGB from the timing controller 110. The data driver 120 converts the digital video data RGB into a gamma compensation voltage in response to the data timing control signal received from the timing controller 110 and generates the data voltage. The data driver 120 synchronizes the data voltage with a gate pulse and supplies the data voltage to the data lines of the display panel 100.

The gate driving circuit includes the level shifter 130 and the shift register 140 connected between the timing controller 110 and the gate lines of the display panel 100.

The level shifter 130 level-shifts transistor-transistor-logic (TTL) level voltages of the odd-numbered and even-numbered gate clocks CLK_O and CLK_E received from the timing controller 110 to a gate high voltage VGH and a gate low voltage VGL.

The shift register 140 includes stages that shift the start signal VST based on the odd-numbered and even-numbered gate clocks CLK_O and CLK_E and sequentially output a carry signal and a gate pulse Gout.

The gate driving circuit may be formed on a lower substrate of the display panel 100 in a gate-in-panel (GIP) manner. In the GIP manner, the level shifter 130 may be mounted on a printed circuit board (PCB), and the shift register 140 may be formed on the lower substrate of the display panel 100.

Figure 2:
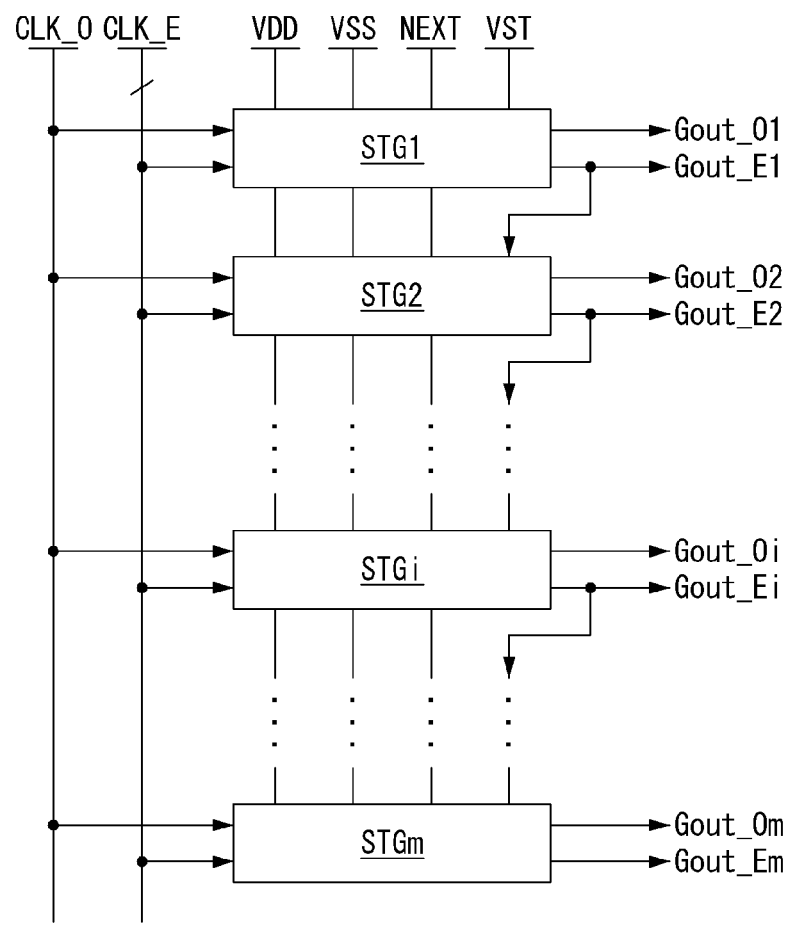
FIG. 2 illustrates a shift register according to an embodiment of the invention.

FIG. 2 illustrates a shift register according to an embodiment of the invention.

With reference to FIG. 2, the shift register 140 according to the embodiment of the invention includes first to mth stages STG1 to STGm, that are connected in cascade. An ith stage STGi outputs an ith odd-numbered gate pulse Gout_Oi and an ith even-numbered gate pulse Gout_Ei. As described above, each stage of the shift register 140 according to the embodiment of the invention outputs a pair of gate pulses. Therefore, when the total number of gate lines GL is 2*m, the embodiment of the invention can entirely drive the display panel 100 using only the m stages. As shown in FIG. 1, the shift register 140 may be positioned outside the display area 100A of the display panel 100. Namely, because the number of stages of the shift register 140 formed in the non-display area 100B, i.e., a bezel area of the display panel 100 can be reduced to one half, a size of the bezel area can decrease.

The gate pulse is applied to the gate lines of the display device, and at the same time may be used as a carry signal transferred to a preceding stage and a subsequent stage.

In the following description, "preceding stage" is a stage positioned on an upper part of a base stage. For example, when the ith stage STGi is used as a base stage, the preceding stage is one of the first to (i−1)th stages STG1 to STG(i−1). Further, "subsequent stage" is a stage positioned on a lower part of a base stage. For example, when the ith stage STGi is used as a base stage, the subsequent stage is one of the (i+1)th to mth stages STG(i+1) to STGm.

Figure 3:
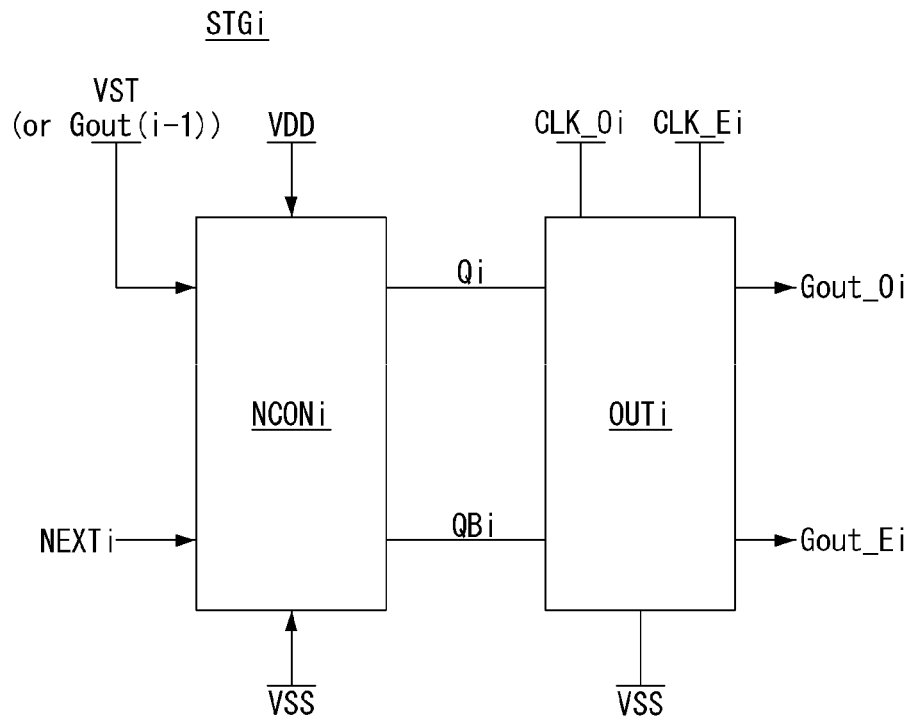
FIG. 3 illustrates a stage of a shift register according to an embodiment of the invention.
Figure 4:
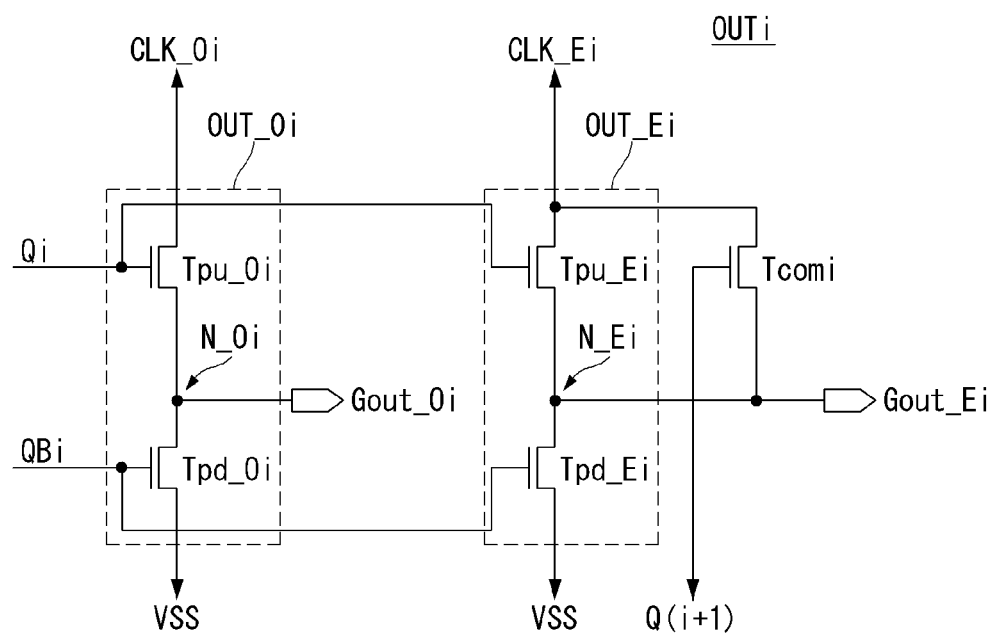
FIG. 4 illustrates an output unit of a stage according to an embodiment of the invention.

FIG. 3 is a block diagram illustrating configuration of an ith stage shown in FIG. 2, where 'i' is a natural number satisfying 2<i<m. FIG. 4 illustrates an example of an output unit shown in FIG. 3.

With reference to FIGS. 3 and 4, an ith stage STGi includes a node control circuit NCON(i) and an output unit OUT(i).

The node control circuit NCON(i) controls a voltage of a Q node Q(i) and a voltage of a QB node QB(i). The Q node Q(i) controls operations of pull-up transistors Tpu_O(i) and Tpu_E(i) of the output unit OUT(i), and the QB node QB(i) controls operations of pull-down transistors Tpd_O(i) and Tpd_E(i) of the output unit OUT(i). The node control circuit NCON(i) receives a start pulse VST, a subsequent signal NEXT(i), and a high potential voltage VDD, so as to control the Q node Q(i) and the QB node QB(i). The start pulse VST(i) controls an operation start of the ith stage STGi, and the subsequent signal NEXT(i) controls an operation end of the ith stage STGi.

The output unit OUT(i) includes an odd-numbered output unit OUT_O(i) and an even-numbered output unit OUT_E(i). The odd-numbered output unit OUT_O(i) outputs an odd-numbered gate pulse Gout_O(i), and the even-numbered output unit OUT_E(i) outputs an even-numbered gate pulse Gout_E(i).

The odd-numbered output unit OUT_O(i) includes an odd-numbered pull-up transistor Tpu_O(i) and an odd-numbered pull-down transistor Tpd_O(i). A gate electrode of the odd-numbered pull-up transistor Tpu_O(i) is connected to the Q node Q(i), a first electrode of the odd-numbered pull-up transistor Tpu_O(i) is connected to an odd-numbered gate clock CLK_O(i), and a second electrode of the odd-numbered pull-up transistor Tpu_O(i) is connected to an odd-numbered output terminal N_O(i). A gate electrode of the odd-numbered pull-down transistor Tpd_O(i) is connected to the QB node QB(i), a first electrode of the odd-numbered pull-down transistor Tpd_O(i) is connected to the odd-numbered output terminal N_O(i), and a second electrode of the odd-numbered pull-down transistor Tpd_O(i) is connected to a low potential voltage source VSS.

When the odd-numbered pull-up transistor Tpu_O(i) receives the odd-numbered gate clock CLK_O(i) through the first electrode in a state where the Q node Q(i) is precharged, the odd-numbered pull-up transistor Tpu_O(i) increases a voltage of the odd-numbered output terminal N_O(i). The odd-numbered pull-down transistor Tpd_O(i) discharges the voltage of the odd-numbered output terminal N_O(i) to a low potential voltage VSS in response to a high level voltage of the QB node QB(i).

The even-numbered output unit OUT_E(i) includes an even-numbered pull-up transistor Tpu_E(i) and an even-numbered pull-down transistor Tpd_E(i). A gate electrode of the even-numbered pull-up transistor Tpu_E(i) is connected to the Q node Q(i), a first electrode of the even-numbered pull-up transistor Tpu_E(i) is connected to an even-numbered gate clock CLK_E(i), and a second electrode of the even-numbered pull-up transistor Tpu_E(i) is connected to an even-numbered output terminal N_E(i). A gate electrode of the even-numbered pull-down transistor Tpd_E(i) is connected to the QB node QB(i), a first electrode of the even-numbered pull-down transistor Tpd_E(i) is connected to an even-numbered output terminal N_E(i), and a second electrode of the even-numbered pull-down transistor Tpd_E(i) is connected to the low potential voltage source VSS.

The even-numbered pull-up transistor Tpu_E(i) outputs the even-numbered gate clock CLK_E(i) received through the first electrode as an even-numbered gate pulse Gout_E(i) in response to a high level voltage of the Q node Q(i). The even-numbered pull-down transistor Tpd_E(i) discharges the voltage of the even-numbered output terminal N_E(i) to the low potential voltage VSS in response to the high level voltage of the QB node QB(i).

A compensation transistor Tcom(i) compensates for a difference between a voltage of the gate electrode of the odd-numbered pull-up transistor Tpu_O(i) and a voltage of the gate electrode of the even-numbered pull-up transistor Tpu_E(i) at a time at which the odd-numbered output terminal N_O(i) and the even-numbered output terminal N_E(i) are discharged. To this end, a gate electrode of the compensation transistor Tcom(i) is connected to the Q node Q(i+1) of a subsequent stage, a first electrode of the compensation transistor Tcom(i) is connected to an input terminal of the even-numbered gate clock CLK_E(i), and a second electrode of the compensation transistor Tcom(i) is connected to the even-numbered output terminal N_E(i).

Figure 5:
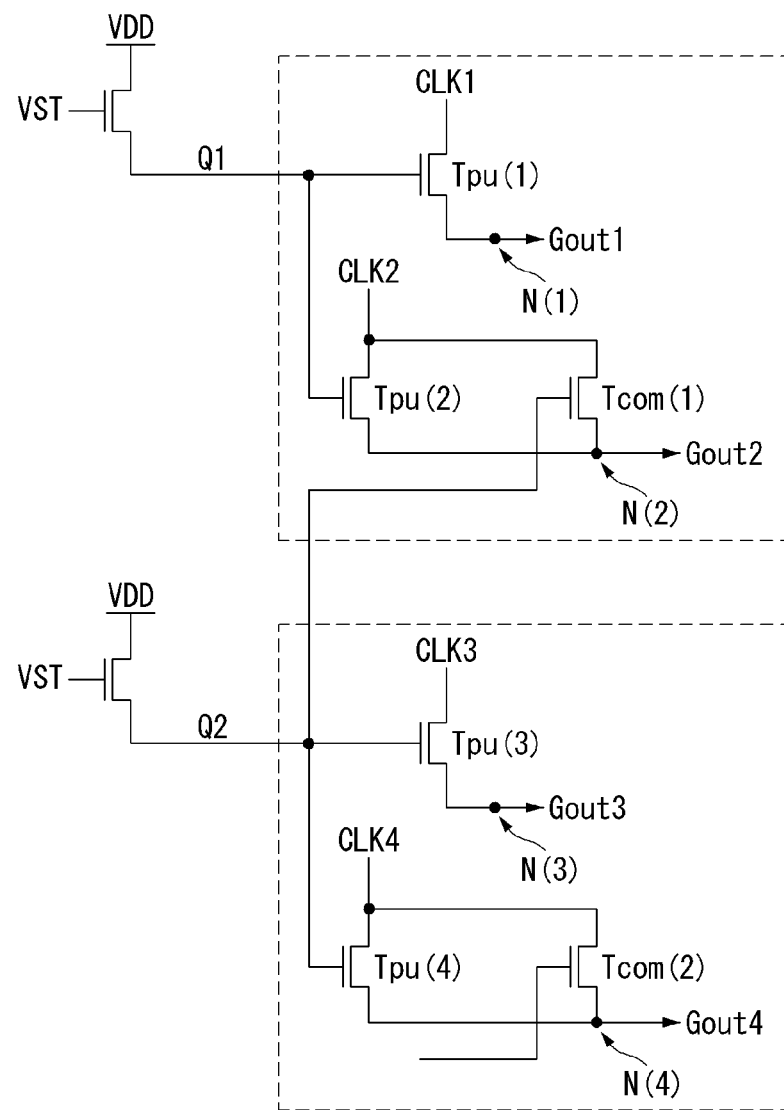
FIG. 5 illustrates first and second stages according to an embodiment of the invention.

FIG. 5 illustrates first and second stages of the shift register according to the embodiment of the invention (the pull-down transistors are not shown). A first odd-numbered gate clock and a first even-numbered gate clock input to a first stage STG1 correspond to a first gate clock and a second gate clock respectively. A first odd-numbered gate pulse and a first even-numbered gate pulse output by the first stage STG1 correspond to a first gate pulse and a second gate pulse respectively. Thus, in FIG. 5, the odd-numbered and even-numbered components related to the first stage STG1 are represented as first and second components respectively, and the odd-numbered and even-numbered components related to the second stage STG2 are represented as third and fourth components respectively.

Figure 6:
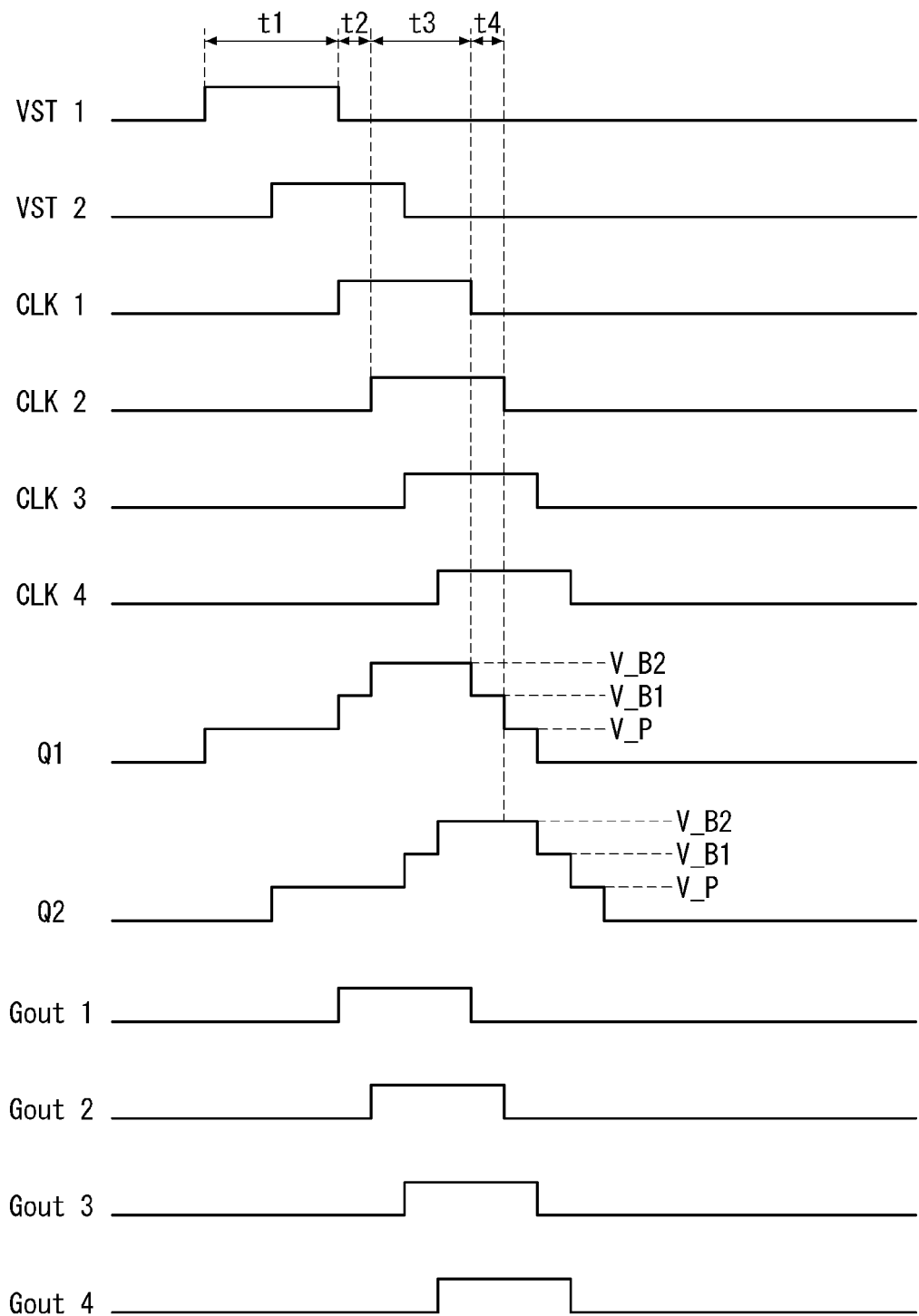
FIG. 6 is a timing diagram illustrating changes in a voltage of a main node depending on an operation of stages shown in FIG. 5.

FIG. 6 is a timing diagram illustrating a voltage of a clock signal input to first and second stages, a voltage of a Q node, and a voltage of an output terminal. In FIG. 6, for example, a gate pulse is output during four horizontal periods.

Operations of the first and second stages are described with reference to FIGS. 3, 5, and 6.

During a first period t1, a node control circuit NCON receives a start pulse VST and precharges a first Q node Q1. As a result, a voltage of the first Q node Q1 becomes a precharge voltage V_P in the first period t1.

During second and third periods t2 and t3, a first pull-up transistor Tpu1 of a first output unit receives a first gate clock CLK1 through a first electrode of the first pull-up transistor Tpu1.

During the second period t2, the first Q node Q1 is first bootstrapped by the first gate clock CLK1 applied to the first electrode of the first pull-up transistor Tpu1. As a result, a voltage of the first Q node Q1 increases from the precharge voltage V_P to a first bootstrapping voltage V_B1. When a gate-to-source voltage reaches a threshold voltage Vth in a process for bootstrapping a gate electrode of the first pull-up transistor Tpu1, the first pull-up transistor Tpu1 is turned on. As the first pull-up transistor Tpu1 is turned on, a voltage of a first output terminal N1 increases due to a current flowing from the first electrode to a second electrode of the first pull-up transistor Tpu1. As a result, a first gate pulse Gout1 is output through the first output terminal N1.

During third and fourth periods t3 and t4, a second gate clock CLK2 is applied to a first electrode of a second pull-up transistor Tpu2.

During the third period t3, the first Q node Q1 is second bootstrapped by the second gate clock CLK2 applied to the first electrode of the second pull-up transistor Tpu2. As a result, the voltage of the first Q node Q1 increases from the first bootstrapping voltage V_B1 to a second bootstrapping voltage V_B2. After the third period t3 ends, the voltage of the first gate clock CLK1 is inverted to a low voltage level. Hence, the voltage of the first output terminal N1 is discharged, and the output of the first gate pulse Gout1 stops. Namely, the voltage of the first output terminal N1 is discharged in a state where the voltage of the gate electrode of the first pull-up transistor Tpu1 is the second bootstrapping voltage V_B2.

Further, the second pull-up transistor Tpu2 is turned on in the bootstrapping process and increases a voltage of a second output terminal N2. As a result, a second gate pulse Gout2 is output through the second output terminal N2 from the third period t3.

Because the first gate clock CLK1 is not applied in the fourth period t4, the first pull-up transistor Tpu1 does not bootstrap the first Q node Q1. Thus, the voltage of the first Q node Q1 decreases from the second bootstrapping voltage V_B2 to the first bootstrapping voltage V_B1 in the fourth period t4.

After the fourth period t4 passed, the voltage of the second gate clock CLK2 is inverted to a low voltage level. Hence, the voltage of the second output terminal N2 is discharged, and the output of the second gate pulse Gout2 stops. A first compensation transistor Tcom1 operates in response to a voltage of a second Q node Q2 in a process for discharging the voltage of the second output terminal N2. As shown in FIG. 6, the voltage of the second stage STG2 increases to the second bootstrapping voltage V_B2 by a fourth gate clock CLK4. Thus, the second output terminal N2 is discharged from the second bootstrapping voltage V_B2.

As described above, both the first output terminal N1 and the second output terminal N2 of the first stage STG1 are discharged from the second bootstrapping voltage V_B2. Namely, a gate-to-source voltage of the first pull-up transistor Tpu1 in a process for discharging the first output terminal N1 is substantially equal to a gate-to-source voltage of the first compensation transistor Tcom1 in a process for discharging the second output terminal N2. As a result, because there is a small difference between a voltage change amount in the process for discharging the first output terminal N1 and a voltage change amount in the process for discharging the second output terminal N2, the first gate pulse Gout1 and the second gate pulse Gout2 obtain a delay of the substantially same level when the first gate pulse Gout1 and the second gate pulse Gout2 fall to a low potential voltage. Further, the embodiment of the invention can prevent a dim phenomenon of a horizontal direction resulting from a delay difference between the first gate pulse Gout1 and the second gate pulse Gout2 can be prevented.

The embodiment of the invention and a comparative example are described below.

Figure 7:
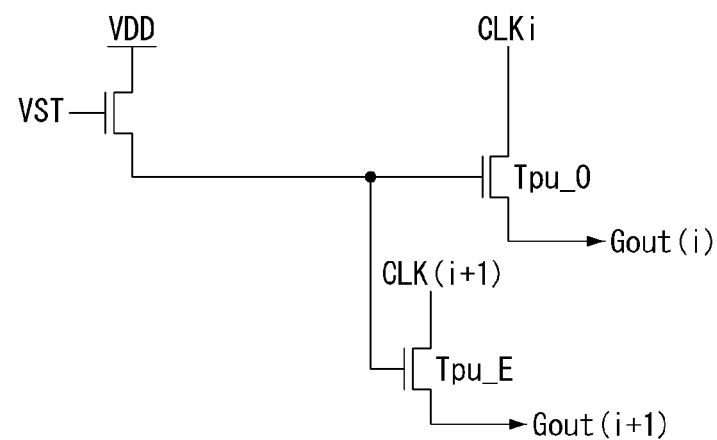
FIG. 7 illustrates an output unit of a stage according to a comparative example.
Figure 8:
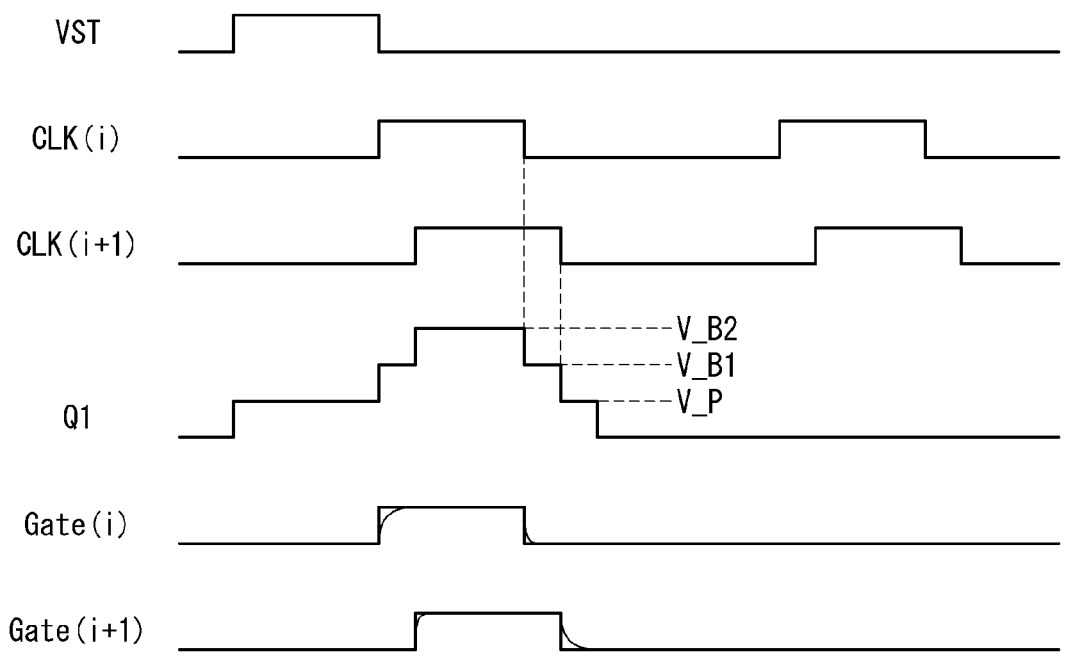
FIG. 8 is a timing diagram illustrating changes in a voltage of a main node depending on an operation of a stage shown in FIG. 7.

FIG. 7 illustrates an output terminal of a stage according to a comparative example. FIG. 8 illustrates changes in a voltage of a Q node and an output terminal depending on an operation of a stage shown in FIG. 7.

According to a comparative example shown in FIG. 7, an ith gate pulse Gout(i) is output using a first pull-up transistor Tpu_O, and an (i+1)th gate pulse Gout(i+1) is output using a second pull-up transistor Tpu_E. The ith gate pulse Gout(i) is discharged to the second bootstrapping voltage V_B2, and the (i+1)th gate pulse Gout(i+1) is discharged to the first bootstrapping voltage V_B1. A voltage change amount when an output terminal is discharged is proportional to a gate-to-source voltage of a transistor connected to the output terminal. Thus, the comparative example increases a voltage change amount when the ith gate pulse Gout(i) is discharged, and decreases a voltage change amount when the (i+1)th gate pulse Gout(i+1) is discharged. As a result, a delay difference between the ith gate pulse Gout(i) and the (i+1)th gate pulse Gout(i+1) according to the comparative example is generated. When the delay difference between the ith gate pulse Gout(i) and the (i+1)th gate pulse Gout (i+1) is generated, a charging time of the data voltage using the ith gate pulse Gout(i) and the (i+1)th gate pulse Gout (i+1) varies. Namely, time required to charge an ith gate line supplied with the ith gate pulse Gout(i) with the data voltage is different from time required to charge an (i+1)th gate line supplied with the (i+1)th gate pulse Gout(i+1) with the data voltage. Thus, although the same data voltage is applied to ith pixels arranged on the ith gate line and (i+1)th pixels arranged on the (i+1)th gate line, the ith pixels and the (i+1)th pixels represent different gray levels. As a result, a dim phenomenon is generated along a direction of the gate line.

On the other hand, the embodiment of the invention can remove a delay difference of the gate pulse using the compensation transistor Tcom and can prevent a horizontal dim phenomenon which may be generated in the comparative example.

It will be apparent to those skilled in the art that various modifications and variations can be made in the shift register and the display device of the present invention without departing from the spirit or scope of the invention. Thus, it is intended that the present invention cover the modifications and variations of this invention provided they come within the scope of the appended claims and their equivalents.

What is claimed is:

1. A shift register configured to sequentially output a gate pulse to gate lines of a pixel array, comprising:
   a first stage configured to sequentially output the gate pulse to first and second gate lines of the pixel array corresponding to a voltage of a first Q node; and
   a second stage configured to sequentially output the gate pulse to third and fourth gate lines of the pixel array corresponding to a voltage of a second Q node,
   wherein the first stage includes:
   a start controller charged with the voltage of the first Q node;
   a first pull-up transistor configured to increase a voltage of a first output terminal in response to the voltage of the first Q node and a first gate clock;
   a second pull-up transistor configured to increase a voltage of a second output terminal in response to the voltage of the first Q node and a second gate clock; and
   a compensation transistor configured to discharge the second gate clock using the voltage of the second Q node as a gate voltage.

2. The shift register of claim 1, wherein a gate electrode of the first pull-up transistor is connected to the first Q node, a first electrode of the first pull-up transistor is connected to an input terminal of the first gate clock, and a second electrode of the first pull-up transistor is connected to the first output terminal, and
   wherein a gate electrode of the second pull-up transistor is connected to the first Q node, a first electrode of the second pull-up transistor is connected to an input terminal of the second gate clock, and a second electrode of the second pull-up transistor is connected to the second output terminal.

3. The shift register of claim 2, wherein a gate electrode of the compensation transistor is connected to the second Q node, a first electrode of the compensation transistor is connected to the input terminal of the second gate clock, and a second electrode of the compensation transistor is connected to the second output terminal.

4. The shift register of claim 2, wherein the first gate clock is applied to the first electrode of the first pull-up transistor in a state where the first Q node is precharged, and first bootstraps the first Q node, and
   wherein the second gate clock is applied to the first electrode of the second pull-up transistor before the first gate clock ends, and second bootstraps the first Q node.

5. The shift register of claim 4, wherein the second stage includes:
   a third pull-up transistor including a gate electrode connected to the second Q node, a first electrode connected to an input terminal of a third gate clock, and a second electrode connected to a third output terminal; and
   a fourth pull-up transistor including a gate electrode connected to the second Q node, a first electrode connected to an input terminal of a fourth gate clock, and a second electrode connected to a fourth output terminal,
   wherein the fourth gate clock is input to the fourth pull-up transistor before the third gate clock falls, and second bootstraps a second node, that is first bootstrapped by the third gate clock, and
   wherein a falling time of the second gate clock is arranged in an overlap period of the third gate clock and the fourth gate clock.

6. The shift register of claim 1, wherein the first stage further includes:
   a first pull-down transistor including a gate electrode connected to a first QB node, a first electrode connected to the first output terminal, and a second electrode connected to a low potential voltage source; and
   a second pull-down transistor including a gate electrode connected to the first QB node, a first electrode connected to the second output terminal, and a second electrode connected to the low potential voltage source.

7. A display device, comprising:
   a pixel array disposed in a display area;
   a shift register positioned outside the pixel array and configured to sequentially output a gate pulse to gate lines of the pixel array; and
   a data driver configured to output a data voltage in synchronization with the gate pulse,
   wherein the shift register includes:
   a first stage configured to sequentially output the gate pulse to first and second gate lines of the pixel array corresponding to a voltage of a first Q node; and
   a second stage configured to sequentially output the gate pulse to third and fourth gate lines of the pixel array corresponding to a voltage of a second Q node,
   wherein the first stage includes:
   a start controller charged with the voltage of the first Q node;
   a first pull-up transistor configured to increase a voltage of a first output terminal in response to the voltage of the first Q node and a first gate clock;
   a second pull-up transistor configured to increase a voltage of a second output terminal in response to the voltage of the first Q node and a second gate clock; and
   a compensation transistor configured to discharge the second gate clock using the voltage of the second Q node as a gate voltage.

8. The display device of claim 7, wherein a gate electrode of the first pull-up transistor is connected to the first Q node, a first electrode of the first pull-up transistor is connected to an input terminal of the first gate clock, and a second electrode of the first pull-up transistor is connected to the first output terminal, and
   wherein a gate electrode of the second pull-up transistor is connected to the first Q node, a first electrode of the second pull-up transistor is connected to an input terminal of the second gate clock, and a second electrode of the second pull-up transistor is connected to the second output terminal.

9. The display device of claim 8, wherein a gate electrode of the compensation transistor is connected to the second Q node, a first electrode of the compensation transistor is connected to the input terminal of the second gate clock, and a second electrode of the compensation transistor is connected to the second output terminal.

10. The display device of claim 8, wherein the first gate clock is applied to the first electrode of the first pull-up transistor in a state where the first Q node is precharged, and first bootstraps the first Q node, and
    wherein the second gate clock is applied to the first electrode of the second pull-up transistor before the first gate clock ends, and second bootstraps the first Q node.

11. The display device of claim 10, wherein the second stage includes:
    a third pull-up transistor including a gate electrode connected to the second Q node, a first electrode connected to an input terminal of a third gate clock, and a second electrode connected to a third output terminal; and
    a fourth pull-up transistor including a gate electrode connected to the second Q node, a first electrode connected to an input terminal of a fourth gate clock, and a second electrode connected to a fourth output terminal,
    wherein the fourth gate clock is input to the fourth pull-up transistor before the third gate clock falls, and second bootstraps a second node, that is first bootstrapped by the third gate clock, and
    wherein a falling time of the second gate clock is arranged in an overlap period of the third gate clock and the fourth gate clock.

12. The display device of claim 7, wherein the first stage further includes:
    a first pull-down transistor including a gate electrode connected to a first QB node, a first electrode connected to the first output terminal, and a second electrode connected to a low potential voltage source; and
    a second pull-down transistor including a gate electrode connected to the first QB node, a first electrode connected to the second output terminal, and a second electrode connected to the low potential voltage source.

* * * * *